United States Patent [19]

Oppermann

[11] Patent Number: 5,747,867
[45] Date of Patent: May 5, 1998

[54] INTEGRATED CIRCUIT STRUCTURE WITH INTERCONNECT FORMED ALONG WALLS OF SILICON ISLAND

[75] Inventor: Klaus-Guenter Oppermann, Holzkirchen, Germany

[73] Assignee: Siemens Aktiengesellschaft, Munich, Germany

[21] Appl. No.: 573,359

[22] Filed: Dec. 15, 1995

[30] Foreign Application Priority Data

Jan. 9, 1995 [DE] Germany ............... 19500392.6

[51] Int. Cl.⁶ .................................................. H01L 29/00
[52] U.S. Cl. ........................... 257/507; 257/776; 438/280
[58] Field of Search ............................. 257/507, 508, 257/622, 776, 380, 381; 438/280

[56] References Cited

U.S. PATENT DOCUMENTS 5,283,461  2/1994  Beasom ................... 257/508

FOREIGN PATENT DOCUMENTS 32 15 149 A1  1/1983  Germany .
43 17 570 A1  12/1993  Germany .
3-276727  12/1991  Japan ............... 257/508
2215124  9/1989  United Kingdom ........ 257/776
WO 92/02958  2/1992  WIPO .

OTHER PUBLICATIONS

IEEE Transactions on Electron Devices, vol. 38, No. 7, New York, Jul. (1991), "Breakdown Voltage Enhancement for Devices on Thin Silicon Layer/Silicon Dioxide Film" Akio Nakagawa et al, pp. 1650–1654.
Halbleiterelektronik Band 13, Springer Verlag, 1980, "Integrierte Bipolarschaltungen", H.M. Rein et al, pp. 62–66.
B.G. Teubner Stuttgart, 1991, "Halbleiter–Technologie", Heinz Beneking, pp. 368–371.

*Primary Examiner*—Jerome Jackson
*Assistant Examiner*—Nathan K. Kelley
*Attorney, Agent, or Firm*—Hill & Simpson

[57] ABSTRACT

Insulating trenches (2) in the silicon layer of an SOI substrate that extend onto the insulating layer of the SOI substrate define silicon islands (3). At least one of the silicon islands (3) is an interconnect segment (3a) by a diffusion zone that is arranged at the walls of the surrounding trench (2) and that is formed by drive-out from an occupation layer introduced into the trench. The interconnect segment (3a) is suitable as an underpass for crossing interconnects (6a, 6b) or as an additional metallization level.

11 Claims, 2 Drawing Sheets

5,747,867

INTEGRATED CIRCUIT STRUCTURE WITH INTERCONNECT FORMED ALONG WALLS OF SILICON ISLAND

BACKGROUND OF THE INVENTION

Interconnects that are low-impedance and voltage-stable are required in integrated circuit structures for connecting individual circuit elements. The electric strength of the interconnects must be designed according to the occurring voltages. Considerable voltage levels in the range of a few hundred Volts can occur in integrated circuit arrangements that have power components such as, for example, IGBTs.

In integrated circuit arrangements having a multi-layer metallization, crossings of interconnects can be realized by an underpass of an interconnect in a wiring level lying therebelow. Since the various wiring levels are insulated from one another in voltage-stable fashion by an intermediate oxide, the crossing of the interconnects has a comparable electric strength.

In integrated circuit arrangements having only one metallization level, crossings of interconnects are often realized by polysilicon strips that are arranged over or under the wiring level. Since polysilicon has a much higher sheet resistivity than aluminum (which is usually employed for the wiring levels) the high sheet resistivity of the underpass must be sufficient or a comparatively thick polysilicon strip must be provided. For comparison: a 1 μm thick aluminum interconnect has a sheet resistivity of about $R_s=0.04\Omega/\square$, a 0.2 μm thick polysilicon strip has a sheet resistivity $R_s=80\Omega/\square$, and a 0.5 μm thick polysilicon strip has a sheet resistivity $R_s=17\Omega/\square$.

It is also known (see, for example, H. M. Rein et al., Integrierte Bipolarschaltungen, *Halbleiterelektronik*, Vol.13, Springer Verlag 1980, pages 62–66) to utilize diffusion zones for interconnect underpasses. These diffusion zones are arranged in the substrate under the interconnect to be conducted underneath and projecting beyond it at both sides. Such diffusion zones have a sheet resistivity of about 35 through $45\Omega/\square$. They must always be polarized in a non-conducting direction relative to the substrate in order to prevent an injection of minority charge carriers into the substrate. Furthermore, the breakdown voltage of the pn-junction formed by the diffusion zone and the basic doping of the substrate must not be exceeded. Diffusion zones can therefore be employed as an interconnect underpass to a limited extent.

It has been proposed in International Application WO 92/02958 to etch trenches, whose floor and sidewalls are covered with insulating material, and to fill these up with conductive polysilicon that can be reinforced by a tungsten layer for improving the conductivity. This buried interconnect that is insulated from the substrate is contacted and is suitable as an underpass.

SUMMARY OF THE INVENTION

It is an object of the present invention to provide an integrated circuit structure and a method for the manufactures thereof wherein a further wiring level usable as interconnect underpass is available.

In general terms the present invention is an integrated circuit structure, having an SOI substrate that encompasses a silicon wafer, an insulating layer arranged on the SOI substrate and a monocrystalline silicon layer arranged on the latter. Insulating trenches extend from the surface of the monocrystalline silicon layer down onto the insulating layer and define silicon islands in the monocrystalline silicon layer. The silicon islands are respectively completely surrounded by an insulating trench and are thereby insulated from one another. At least one interconnect segment is realized in one of the silicon islands by a diffusion zone arranged along the surrounding trench walls.

Advantageous developments of the present invention are as follows.

An intermediate oxide layer is arranged on the surface of the monocrystalline silicon layer. A first via hole and a second via hole are provided in the intermediate oxide layer, each thereof respectively meeting the interconnect segment and being provided with a first contact and with a second contact.

A first conductive structure that is connected to the first contact and a second conductive structure that is connected to the second contact are arranged on the surface of the intermediate oxide layer.

The first conductive structure and the second conductive structure respectively have contacts to components that are arranged in two different silicon islands.

The first conductive structure and the second conductive structure are respectively parts of an interconnect arranged on the surface of the intermediate oxide layer and interrupted in the region of the interconnect segment at the surface of the intermediate oxide layer.

The dopant concentration of the diffusion zone in the interconnect segment is in the range from $10^{18}$ to $10^{21}$ $cm^{-3}$.

Further insulating trenches, that respectively extend from the surface of the monocrystalline silicon layer down onto the insulating layer and that divide the silicon island into silicon strips connected to one another, are arranged in the silicon island fashioned as the interconnect segment. Further diffusion zones are provided along the walls of the further insulating trenches in the silicon island.

The present invention is also a method for manufacturing an integrated circuit structure, whereby trenches are etched in an SOI substrate that encompasses a silicon wafer with an insulating layer arranged thereon and a monocrystalline silicon layer arranged on the latter. The trenches extend form the surface of the monocrystalline layer down onto the surface of the insulating layer and define silicon islands in the monocrystalline silicon layer that are respectively completely surrounded by a trench. An interconnect segment is formed in one of the silicon islands in that at least the surface of the trench surrounding this silicon island is provided with an occupation layer. Diffusion zones are formed in this silicon island by drive-out. The trenches are then filled with insulation structures.

Advantageous developments of the method of the present invention are as follows.

After the filling of the trenches with insulation structures, an intermediate oxide layer is applied onto the surface of the monocrystalline silicon layer. A first via hole and a second via hole onto the interconnect segment are opened in the intermediate oxide layer and are provided with a first contact and a second contact. A first conductive structure that is electrically connected to the first contact and a second conductive structure that is electrically connected to the second contact are formed on the surface of the intermediate oxide layer.

After the formation of the diffusion zones by drive-out, terminal regions are produced in the surface of the interconnect segment by ion implantation with ions that dope with the same conductivity type.

Further trenches, that respectively extend from the surface of the monocrystalline silicon layer down onto the insulation layer and that divide the silicon island into silicon strips connected to one another, are formed in the silicon island that is fashioned as interconnect segment. The surface of the further trenches is also provided with the occupation layer and diffusion zones along the walls of the further trenches are formed by drive out. The spacing of neighboring trenches in the interconnect segment is set such that the diffusion zones arranged at opposite walls meet.

The present inventive circuit structure is realized in an SOI substrate that has a silicon wafer, an insulating layer (usually of $SiO_2$) arranged thereon, and a monocrystalline silicon layer arranged on the latter. The circuit elements are realized in the monocrystalline silicon layer. For insulating neighboring circuit elements, insulation trenches that respectively extend from the surface of the monocrystalline silicon layer down to the insulating layer are arranged in the monocrystalline silicon layer. Respective silicon islands that are completely surrounded by an insulating trench are defined by the insulating trenches.

Inventively, at least one of these silicon islands is fashioned as an interconnect segment. To that end, a diffusion zone is provided in the silicon island along the wall of the surrounding insulating trench. The diffusion zone has a dopant concentration of $10^{18}$ through $10^{21}$ cm$^{-3}$, preferably $10^{20}$ cm$^{-3}$. The diffusion zone preferably extends into the silicon island to such an extent that parts of the diffusion zone arranged at opposite walls meet and the silicon island is practically completely filled by the diffusion zone.

For enlarging the cross-section of the interconnect segment, it lies within the scope of the present invention to provide further insulating trenches within the silicon island fashioned as interconnect segment. These further insulating trenches respectively extend from the surface of the monocrystalline silicon layer down onto the surface of the insulating layer and divide the silicon island into silicon strips connected to one another. Diffusion zones that preferably meet the diffusion zone arranged at the opposite wall of the silicon island are also arranged along the walls of the further insulating trenches.

For manufacturing the circuit structure, trenches that extend down to the insulating layer are etched into the monocrystalline silicon layer. At least the surface of the trench surrounding the later interconnect segment is provided with an occupation layer from which the diffusion zone in the neighboring silicon is formed by drive-out.

For manufacturing power components in the silicon layer of an SOI substrate, processes are known and standard (see A. Nakagawa, IEEE Trans. on El. Dev., Vol.38, 1991, pages 1650–1654) wherein the individual components are respectively realized in a silicon island in the silicon layer that is completely surrounded by an insulating trench. The silicon island respectively has a diffusion zone at the trench wall that improves the blocking behavior of the circuit. These diffusion zones are also driven out from an occupation layer that is introduced into the trenches. Such processes are referred to as trench-insulated processes with sidewall doping.

The inventive circuit structure can be realized in such a trench-insulated process with sidewall doping with additional process steps. Modifications must merely be made in the mask for trench etching for the inventive circuit structure.

Since the interconnect segments are dielectrically insulated from neighboring circuit elements and the substrate by the surrounding insulating trench and the insulating layer arranged therebelow, high voltages relative to the substrate can be conducted in these interconnect segments. The electric strength of the interconnect segment is only dependent on the thickness of the insulating trench and of the insulating layer. A breakdown as a consequence of avalanche multiplication or an injection of minority charge carriers into the environment are precluded because no pn-junction to the environment arises.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
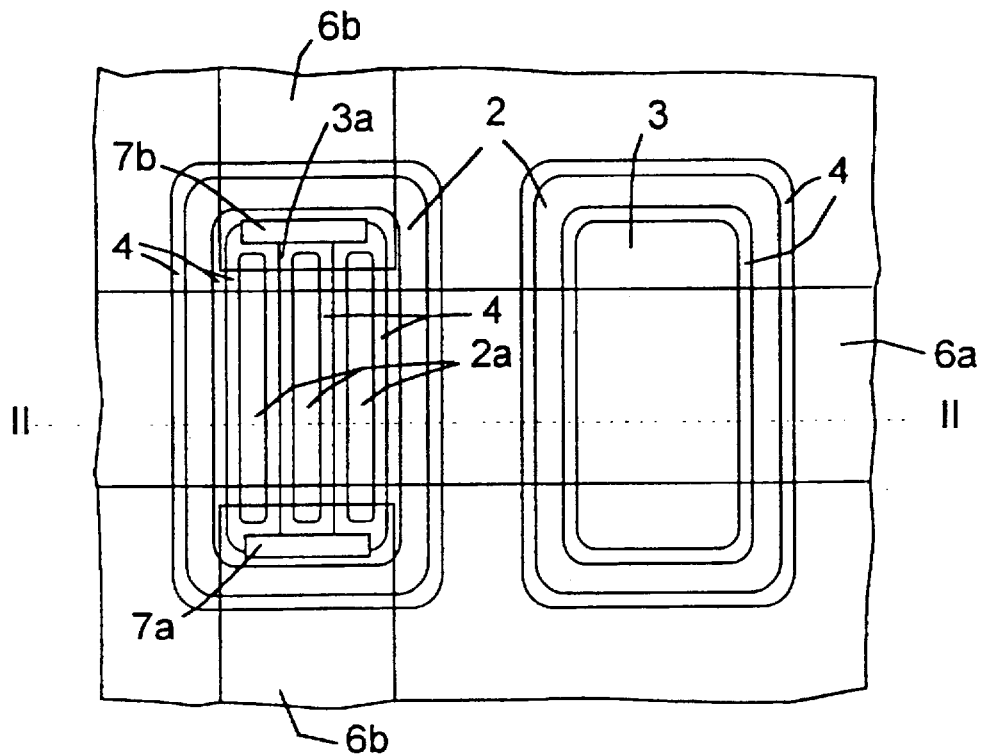
FIG. 1 shows a view onto an integrated circuit structure having an interconnect segment and a silicon island.
Figure 2:
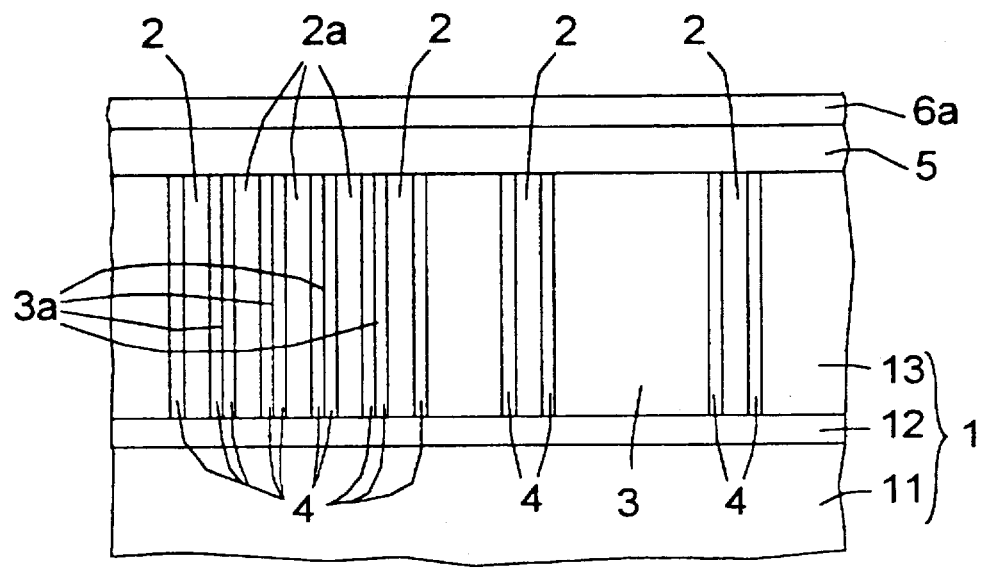
FIG. 2 shows the section identified as II—II in FIG. 1.

A substrate 1 has a silicon wafer 11, an insulating layer 12 arranged thereon and a monocrystalline silicon layer 13 arranged on the latter (see FIG. 1 and FIG. 2). For example, the silicon substrate is p-doped and has a dopant concentration of $10^{18}$ cm$^{-3}$. The insulating layer 12, for example, is composed of $SiO_2$ and has a thickness of, for example, 2 μm. The monocrystalline silicon layer 13, for example, is n-doped and has a dopant concentration of $6 \times 10^{14}$ cm$^{-3}$. It has a thickness of, for example, 20 μm.

Insulating trenches 2 are arranged in the monocrystalline silicon layer 13. The insulating trenches 2 respectively extend from the surface of the monocrystalline silicon layer 13 down to the surface of the insulating layer 12. For example, they are filled with $SiO_2$. The insulating trenches 2 respectively define silicon islands 3, each of which are respectively completely surrounded by the appertaining insulating trench 2. Each of the silicon islands 3 is insulated from the silicon wafer 11 and from the monocrystalline silicon layer 13 by the surrounding insulating trench 2 and the insulating layer 12. The insulating trenches 2 have a width of, for example, 3 μm.

One of the silicon islands 3 is fashioned as interconnect segment 3a. Further insulating trenches 2a that respectively extend from the surface of the monocrystalline silicon layer down onto the insulating layer 12 are provided in the interconnect segment 3a. The further insulating trenches 2a divide the silicon island 3 fashioned as interconnect segment 3a into silicon strips that are mutually connected to one another. The spacing of neighboring, further insulating trenches 2a amounts, for example, to 4 μm.

Diffusion zones 4 are arranged in the silicon islands 3 neighboring the insulating trench 2 and in the interconnect segment 3a neighboring the further insulating trenches 2a, these diffusion zones, for example, being p-doped with a boundary concentration $C_s$ of, for example, $10^{20}$ cm$^{-3}$. The diffusion zones 4 have a junction depth of, for example, 2 μm. As a result, diffusion zones arranged at opposite walls in the interconnect segment 2a meet. In this example, the interconnect segment 3a has a sheet resistivity of about 5.6Ω/□.

An intermediate oxide layer 5 is arranged on the surface of the silicon islands 3, the insulating trenches 2,2a, the monocrystalline silicon layer 13. Interconnects 6a, 6b of aluminum that have a thickness of, for example, 1 μm are arranged on the intermediate oxide layer.

A first via hole 7a and a second via hole 7b are opened in the intermediate oxide layer 5 at opposite sides of the interconnect segment 3a. The via holes 7a,7b respectively extend onto the surface of the diffusion zones 4 and are provided with a contact metallization. The first via hole 7a and the second via hole 7b, as well as, the contact metallizations arranged therein are connected one of the interconnects 6b. The interconnect 6b is interrupted for crossing over the interconnect 6a. The electrical connection between two parts of the interconnect 6b is realized by the interconnect segment 3a.

Figure 3:
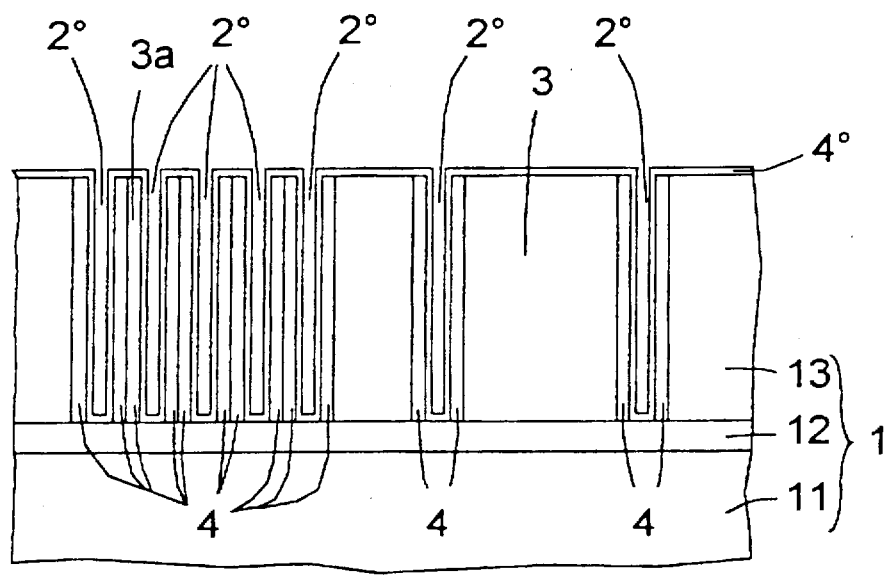
FIG. 3 shows a section through the circuit structure during the manufacturing process.

For manufacturing the inventive circuit 2 structure, trenches $2^0$ are opened in the monocrystalline silicon layer 13 of the SOI substrate 1 by anisotropic etching after appropriate masking (see FIG. 3). The pattern of the trenches $2^0$ corresponds to the arrangement of the insulating trenches 2 and of the further insulating trenches 2a in the finished circuit structure.

An occupation layer 40 that lines the walls of the trenches $2^0$ is applied surface-wide. For example, the occupation layer $4^0$ is formed of doped boron glass or of boron-doped amorphous silicon. The diffusion zones 4 are formed by drive-out into the silicon in a temperature step over about 120 minutes at about 1000° C.

After the removal of the occupation layer 40, the trenches $2^0$ are filled with $SiO_2$, the insulating trenches 2 and the further insulating trenches 2a. An ion implantation with boron is subsequently implemented for improving the conductivity of the interconnect segment 3a, whereby the dopant concentration at the surface of the interconnect segment 3a is raised, for example, to $10^{20}$ cm$^{-3}$. The contact resistance between the interconnect segment 3a and the interconnect 6b is thereby improved.

Subsequently, the intermediate oxide layer 5 is produced by CVD deposition having a thickness of, for example, 2 through 3 μm. The first via hole 7a and the second via hole 7b are opened in the intermediate oxide layer 5 in a standard way and are filled with contact metallizations, for example aluminum or AlSiCu. Finally, the interconnects 6a and 6b are formed.

The interconnect 6b can have contacts to neighboring components, so that the interconnect segment 3a acts as additional wiring level.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. An integrated circuit structure, comprising:
   an SOI substrate that encompasses a silicon wafer, an insulating layer arranged on the SOI substrate and a monocrystalline silicon layer arranged on the insulating layer;
   insulating trenches that respectively extend from a surface of the monocrystalline silicon layer down onto the insulating layer and that define silicon islands in the monocrystalline silicon layer, said silicon islands being respectively completely surrounded by respective insulating trenches and being thereby insulated from one another; and
   at least one interconnect segment formed in one of the silicon islands by a diffusion zone arranged along surrounding trench walls of the insulating trench associated with said one of the silicon islands.

2. The integrated circuit arrangement according to claim 1, wherein an intermediate oxide layer is arranged on a surface of the monocrystalline silicon layer;
   wherein the intermediate oxide layer has a first via hole and a second via hole, each of the first and second via holes respectively meeting the interconnect segment and the first and second via holes being provided with a first contact and with a second contact, respectively; and
   wherein a first conductive structure that is connected to the first contact and a second conductive structure that is connected to the second contact are arranged on a surface of the intermediate oxide layer.

3. The integrated circuit structure according to claim 2, wherein each of the first conductive structure and the second conductive structure have respective contacts to components that are arranged in two different silicon islands.

4. The integrated circuit structure according to claim 2, wherein the first conductive structure and the second conductive structure are respectively parts of an interconnect arranged on the surface of the intermediate oxide layer and interrupted in the region of the interconnect segment at the surface of the intermediate oxide layer.

5. The integrated circuit structure according to claim 1, wherein the dopant concentration of the diffusion zone in the interconnect segment is in the range from $10^{18}$ to $10^{21}$ cm$^{-3}$.

6. The integrated circuit structure according to claim 1, wherein further insulating trenches, that respectively extend from the surface of the monocrystalline silicon layer down onto the insulating layer and that divide the silicon island into silicon strips connected to one another, are arranged in the silicon island that is an interconnect segment, and
   wherein further diffusion zones are provided along the walls of the further insulating trenches in the silicon island that is an interconnect segment.

7. An integrated circuit structure, comprising:
   an SOI substrate that encompasses a silicon wafer, an insulating layer arranged on the SOI substrate and a monocrystalline silicon layer arranged on the insulating layer;
   insulating trenches that respectively extend from a surface of the monocrystalline silicon layer down onto the insulating layer and that define at least one silicon island in the monocrystalline silicon layer, said at least one silicon island being respectively completely surrounded by respective insulating trenches;
   further insulating trenches, that respectively extend from the surface of the monocrystalline silicon layer down onto the insulating layer and that divide the at least one silicon island into silicon strips connected to one another, are arranged in the at least one silicon island;
   further diffusion zones are provided along the walls of the further insulating trenches in the at least one silicon island; and
   at least one interconnect segment formed in the at least one silicon island by a diffusion zone arranged along surrounding trench walls of the insulating trench associated with the at least one silicon islands.

8. The integrated circuit arrangement according to claim 7, wherein an intermediate oxide layer is arranged on a surface of the monocrystalline silicon layer;

wherein the intermediate oxide layer has a first via hole and a second via hole, each of the first and second via holes respectively meeting the interconnect segment and the first and second via holes being provided with a first contact and with a second contact, respectively; and wherein a first conductive structure that is connected to the first contact and a second conductive structure that is connected to the second contact are arranged on a surface of the intermediate oxide layer.

9. The integrated circuit structure according to claim 7, wherein each of the first conductive structure and the second conductive structure have respective contacts to components that are arranged in two different silicon islands.

10. The integrated circuit structure according to claim 7, wherein the first conductive structure and the second conductive structure are respectively parts of an interconnect arranged on the surface of the intermediate oxide layer and interrupted in the region of the interconnect segment at the surface of the intermediate oxide layer.

11. The integrated circuit structure according to claim 7, wherein the dopant concentration of the diffusion zone in the interconnect segment is in the range from $10^{18}$ to $10^{21}$ cm$^{-3}$.

* * * * *